United States Patent [19]

Katoh

[11] Patent Number: 5,235,208

[45] Date of Patent: Aug. 10, 1993

[54] PACKAGE FOR MICROWAVE INTEGRATED CIRCUIT

[75] Inventor: Takayuki Katoh, Itami, Japan

[73] Assignee: Mitsubishi Denki Kabushiki Kaisha, Tokyo, Japan

[21] Appl. No.: 819,974

[22] Filed: Jan. 13, 1992

[30] Foreign Application Priority Data

Feb. 7, 1991 [JP] Japan .................. 3-039518

[51] Int. Cl.$^5$ .................. H01L 23/12; H01L 23/14
[52] U.S. Cl. .................. 257/691; 257/728; 257/698; 333/247
[58] Field of Search ............... 257/691, 728, 698, 692, 257/664; 333/238, 246, 247

[56] References Cited

U.S. PATENT DOCUMENTS

| | | | |
|---|---|---|---|
| 4,881,116 | 11/1989 | Hidada et al. | 257/698 |
| 4,890,155 | 12/1989 | Miyagawa et al. | 257/664 |
| 4,922,324 | 5/1990 | Sudo | 257/700 |

FOREIGN PATENT DOCUMENTS

| | | |
|---|---|---|
| 0249378 | 12/1987 | European Pat. Off. . |
| 0408228 | 1/1991 | European Pat. Off. . |
| 0444820 | 9/1991 | European Pat. Off. . |
| 60-227448 | 11/1985 | Japan . |
| 60-251649 | 12/1985 | Japan . |
| 63-97001 | 4/1988 | Japan . |
| 1-135102 | 5/1989 | Japan . |
| WO8401470 | 4/1984 | PCT Int'l Appl. . |
| 2238911 | 6/1991 | United Kingdom . |

OTHER PUBLICATIONS

Ishitsuka et al., "Low Cost, High-Performance Package For A Multi-Chip MMIC Module", GaAs IC Symposium, IEEE Technical Digest, 1988, pp. 221-224.
Bettner et al., "A Low Cost 'Monolithic-Monolithic' Gain Module", Microwave Journal, 1987, pp. 109-113.

Primary Examiner—Rolf Hille
Assistant Examiner—S. V. Clark
Attorney, Agent, or Firm—Leydig, Voit & Mayer

[57] ABSTRACT

A package for a microwave integrated circuit includes a first dielectric layer having a surface for mounting a microwave integrated circuit on which a transmission line is disposed, a second dielectric layer laminated on the first dielectric layer for surrounding a microwave integrated circuit, a first grounding metal layer on the rear surface of the first dielectric layer, a second grounding metal layer on the second dielectric layer, a first intermediate layer grounding metal on the same plane as the transmission line and forming a co-planar type line with the transmission line, and via holes electrically connecting the intermediate layer grounding metal with the first and second grounding metal layers. Therefore, the transmission line is shielded parallel to the direction of the transmission line. As a result, the spacing of the shielding metal in a cross section perpendicular from the transmission line is reduced, suppressing the inductive component of the package.

18 Claims, 9 Drawing Sheets

FIG. 15
(PRIOR ART)
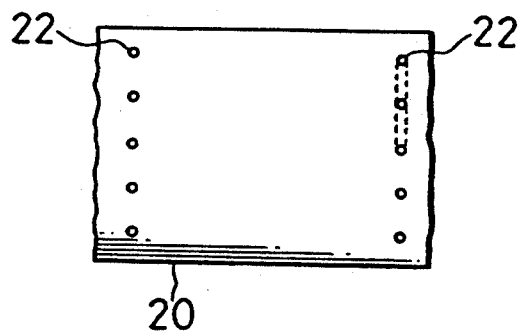
FIG. 16(a)
(PRIOR ART)
FIG. 16(b)
(PRIOR ART)
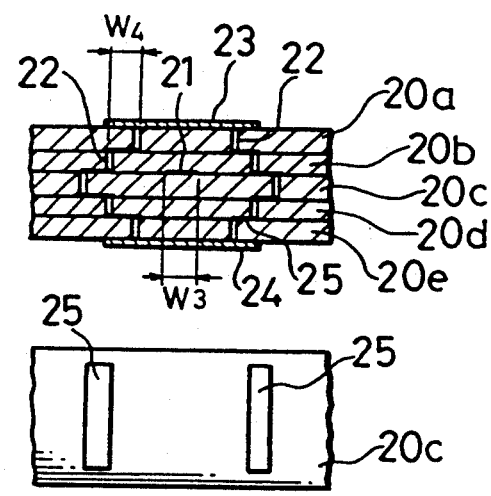

PACKAGE FOR MICROWAVE INTEGRATED CIRCUIT

FIELD OF THE INVENTION

The present invention relates to a package for a semiconductor device operating at high frequency, more than several tens MHz, and, more particularly, to a package for a microwave integrated circuit (hereinafter referred to as IC) in which an intermediate-layer grounding metal is provided on the same plane as a transmission line and an upper-layer grounding metal, the intermediate-layer grounding metal and a lower-layer grounding metal being connected with one another via through holes.

BACKGROUND OF THE INVENTION

FIG. 9 is a perspective view illustrating a prior art micro-strip type chip carrier. In this figure, reference numeral 1 designates a grounding metal base comprising copper-tungsten. A dielectric layer 2 comprising a ceramic is provided on the grounding metal base 1. A transmission line 6 is provided on the surface of the dielectric layer 2. The dielectric layer 2 insulates the transmission line 6 from the grounding metal base 1. The dielectric layer 2 has an aperture in the center thereof, in which an IC chip bonding part 4 for bonding a microwave IC chip 30 is provided. The rear surface of the IC chip bonding part 4 is connected to the grounding metal base 1.

An IC chip 30 is fixed on the IC chip bonding part 4 by solder or adhesive. An electrical signal is transmitted through the transmission line 6 to the IC chip 30. Although this package has an advantage in that the parasitic capacitance and parasitic inductance are shielded, it has a disadvantage in that it cannot be hermetically sealed due to its configuration. In addition, the IC chip 30 and wires are exposed and this package has, in particular, no durability against the mechanical breakage. Therefore, it cannot be used in applications which require package reliability. The frequency of this package is approximately up to 30 GHz.

FIG. 10 is a perspective view illustrating a structure of a prior art dielectric material feed-through type metal package. FIG. 12 is a perspective view illustrating the package of FIG. 10 which is hermetically sealed. In FIGS. 10 and 12, reference numeral 1 designates a grounding metal base. A transmission line 6 is provided on the grounding metal base 1. This transmission line 6 is insulated from the grounding metal base 1 by a ceramic dielectric material layer 2. An IC chip bonding part 4 for bonding an IC chip 30 is provided in the aperture formed in the center of the grounding metal base 1, and a metal collar 8 is provided surrounding the IC chip 30.

The IC chip 30 is fixed on the IC chip bonding part 4 by solder or an adhesive. An electrical signal is transmitted through the transmission line 6 to the chip 30. As shown in FIG. 12, a metal lid 7 is put on the collar 8, protecting the IC chip 30 and forming an airtight enclosure. This package has advantages of airtightness, good shielding properties, and an enhanced high frequency characteristic, so that it can be used up to 20 GHz. However, it has a disadvantage in that the production cost is extremely high.

FIG. 11 is a perspective view illustrating a structure of prior art tri-plate type multi-layer ceramic package. FIG. 13 is side view illustrating the package of FIG. 11 which is hermetically sealed. In FIGS. 11 and 13, a lower-side dielectric layer 2b is provided on a lower-layer grounding metal 1b and an upper-layer grounding metal 1a is provided on an upper-side dielectric layer 2a. A transmission line 6 is provided on the junction surface between the lower-side dielectric layer 2b and the upperside dielectric layer 2a. An IC chip bonding part 4 for fixing an IC chip 30 is provided in the aperture formed in the center of the upper-layer grounding metal 1a and the upper-side dielectric layer 2a. The IC chip bonding part 4 is connected to the lower-layer grounding metal 1b via a through hole.

The IC chip 30 is fixed on the IC chip bonding part 4 by solder or an adhesive. Then, as shown in FIG. 13, a metal lid 7 is put on the package, protecting the IC chip 30 and forming an airtight enclosure. This package has a merit of low production cost, approximately 1000 yen ($7.00) each. However, since the upper-layer grounding metal 1a and the lower-layer grounding metal 1b are not directly in contact with each other, when metal is plated on the side surface of the package to connect the two grounding metals 1a and 1b, the perimeter of the metal layer surrounding the transmission line 6 in the cross section perpendicular to the transmission line 6 is so long that the inductance component increases, reducing shielding and high frequency characteristics. Therefore, this package is used only up to several GHz.

Meanwhile, a prior art package having a pseudo-coaxial line configuration is disclosed in the Japanese Published Patent Application No. 1-135102. FIG. 14(a) is an exploded view illustrating a structure of this prior art package. FIG. 14(b) is a cross-sectional view taken along a line A—A in FIG. 14(a). In FIGS. 14(a) and 14(b), a ceramic layer 20b is provided on a lower-layer grounding metal 24 and a signal conductor 21 is provided in the center of the surface of the ceramic layer 20b. Then, a ceramic layer 20a having a cut-off portion for exposing the signal conductor 21 is provided on the ceramic layer 20b. A plurality of cylindrical via holes 22 are provided penetrating the ceramic layers 20a and 20b. The via holes 22 electrically connect the upper surface of the ceramic layers with the lower surfaces of the ceramic layers. An upper-layer grounding plate 23 is provided on the ceramic layer 20a. The upper-layer grounding metal 23 and the lower-layer grounding metal 24 are connected to each other through the via holes 22 thereby to shield the signal conductor 21.

FIG. 15 is a plan view illustrating a structure of an alternative of the package shown in FIG. 14(a). In this structure, the cylindrical through holes 22 are provided close to each other, resulting in an enhancement of the shielding characteristic.

FIG. 16(a) is a cross-sectional side view illustrating a structure of another alternative of the package shown in FIG. 14(a). FIG. 16(b) is a plan view illustrating a ceramic layer 20c of the package shown in FIG. 16(a). In FIGS. 16(a) and 16(b), a plurality of cylindrical via holes 22 are produced penetrating the ceramic layers 20a to 20e and arranged at slightly different positions to produce a pseudo-coaxial configuration, and the upper surface of a through hole (22) conductor and the lower surface of another through hole (22) conductor are electrically connected by a metal plate 25 which is provided therebetween.

The prior art microwave IC packages constructed as described above have the following drawbacks.

Since the micro-strip type chip carrier shown in FIG. 9 cannot be sealed due to its construction, no good airtight enclosure is obtained. In addition, since the chip and the wires of the package are exposed, the package has no durability against mechanical breakage. Therefore, it is impossible to use the package of FIG. 9 for applications which require reliability.

The dielectric feed-through type metal package shown in FIG. 10 has a good shielding characteristic and a good high frequency characteristic, but the production cost thereof is extremely high.

In the tri-plate type multiple layer ceramic package shown in FIG. 11, when the upper-layer and lower-layer metal plates are connected using metals plated on the side surfaces or external surfaces of the package, the inductance component may be increased, adversely affecting the shielding characteristic and the high-frequency characteristics.

The package shown in FIGS. 14(a) and 15 is shielded by the through holes, but the shielding in parallel to the signal line is not sufficient.

Furthermore, it is difficult to form the package of FIG. 16(a) in a pseudo-coaxial configuration by shifting the through holes and a simulation is required therefor. Since the width $W_3$ of signal line is almost equal to the width $W_4$ of the metal plate, leakage increases, resulting in a transmission loss and a deterioration in the voltage standing wave ratio caused by generation of higher propagation modes.

SUMMARY OF THE INVENTION

The present invention is directed to solving the above described problems and has for its object to provide an IC package which has a good shielding characteristic, a good high frequency characteristic and can be produced at low cost.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, a microwave IC package comprises a first intermediate-layer grounding metal film and a transmission line which are co-planar, an upper-layer grounding metal film and a lower-layer grounding metal film which are provided above and below the intermediate-layer grounding metal film to form a tri-plate type line, and through holes connecting all the grounding metal films. Therefore, the transmission line is shielded parallel to the transmission line, whereby the perimeter of the shielding metal in the cross section perpendicular to the transmission line is shortened. As a result, the inductance component is suppressed.

According to a second aspect of the present invention, the width of the intermediate-layer grounding metal is three to five times as that of the transmission line. Therefore, a leakage of the electric line of force can be reduced and the high frequency characteristic can be improved.

According to a third aspect of the present invention, a second intermediate-layer grounding metal film is provided at a position between the upper-layer grounding metal film and the first intermediate-layer grounding metal film or between the first intermediate-layer grounding metal film and the lower-layer grounding metal film, and all the grounding metal films are connected to one another via the through holes. Therefore, the shielding characteristic and high frequency characteristic of the package are further improved.

BRIEF DESCRIPTION OF THE DRAWINGS

FIG. 15 is a plan view illustrating a structure of a prior art ceramic package in which through holes are provided closely to each other; and FIG. 16(a) is a cross sectional view illustrating a structure of a prior art ceramic package in which through holes are provided at slightly different positions and FIG. 16(b) is a plan view thereof.

DETAILED DESCRIPTION OF THE PREFERRED EMBODIMENTS

Figure 1:
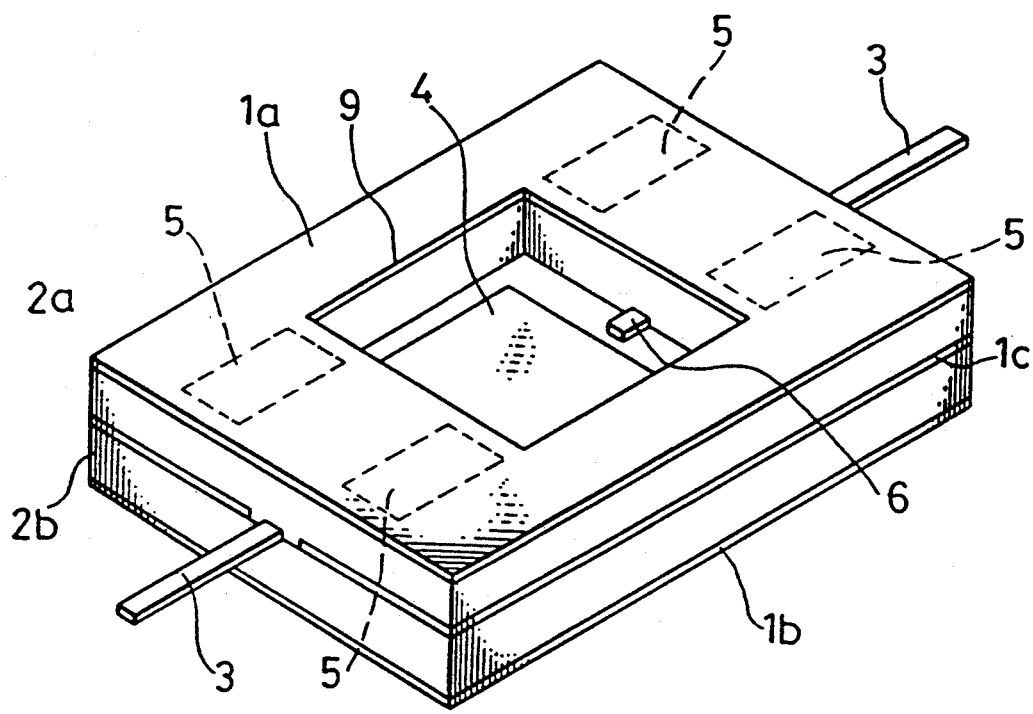
FIG. 1 is a perspective view illustrating a structure of a microwave IC package comprising an intermediate-layer grounding metal in accordance with a first embodiment of the present invention.
Figure 2:
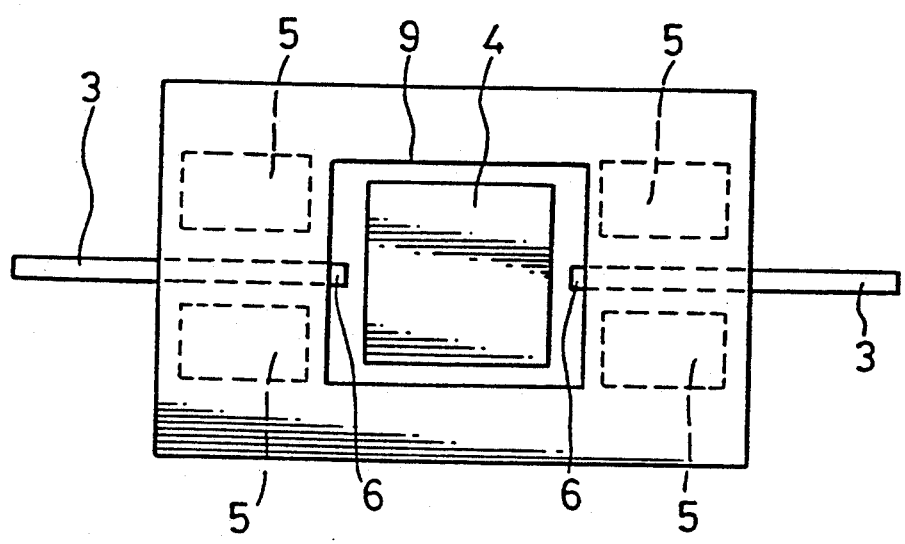
FIG. 2 is a plan view illustrating the microwave IC package of FIG. 1.
Figure 3:
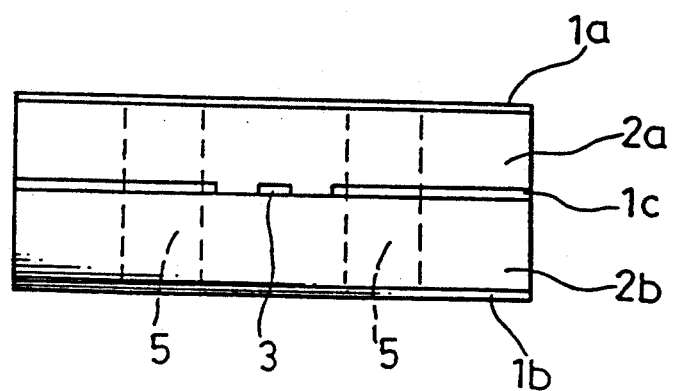
FIG. 3 is a side view illustrating the microwave IC package of FIG. 1.
Figure 7:
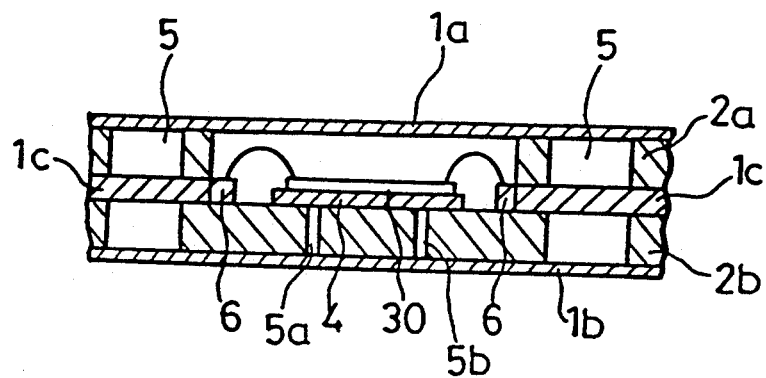
FIG. 7 is a side view illustrating a cross section of the microwave IC package of FIG. 1 on which an IC chip is mounted.
Figure 8:
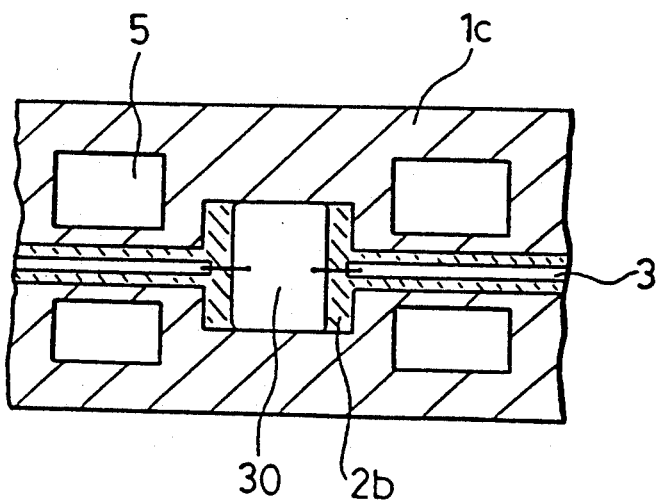
FIG. 8 is a plan view illustrating a cross section of the microwave IC package of FIG. 1 on which an IC chip is mounted.
Figure 9:
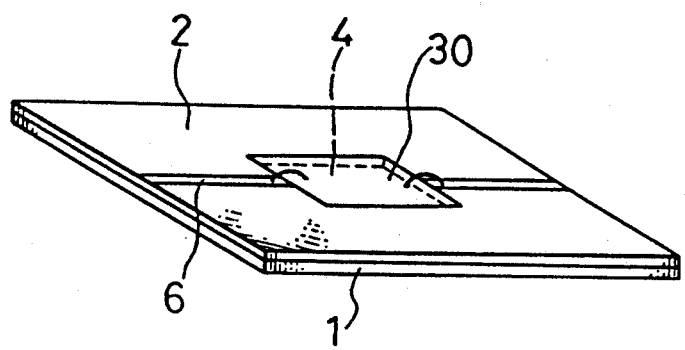
FIG. 9 is a perspective view illustrating a structure of a prior art micro-strip type chip carrier.
Figure 10:
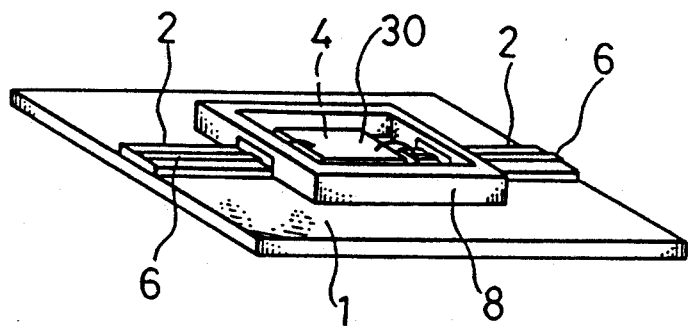
FIG. 10 is a perspective view illustrating a structure of a prior art dielectric feed-through type metal package.
Figure 11:
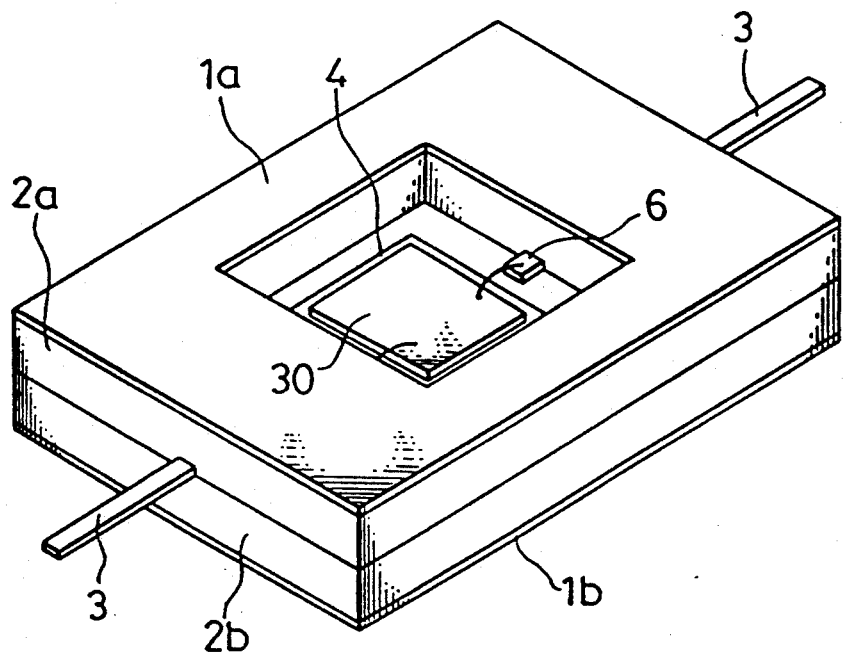
FIG. 11 is a perspective view illustrating a structure of a prior art tri-plate type multiple layer ceramic package.
Figure 12:
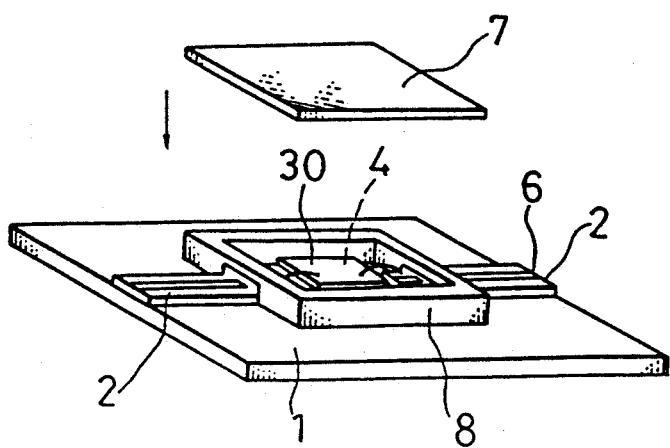
FIG. 12 is a perspective view illustrating the prior art dielectric feed-through type metal package of FIG. 10 which is hermetically sealed.
Figure 13:
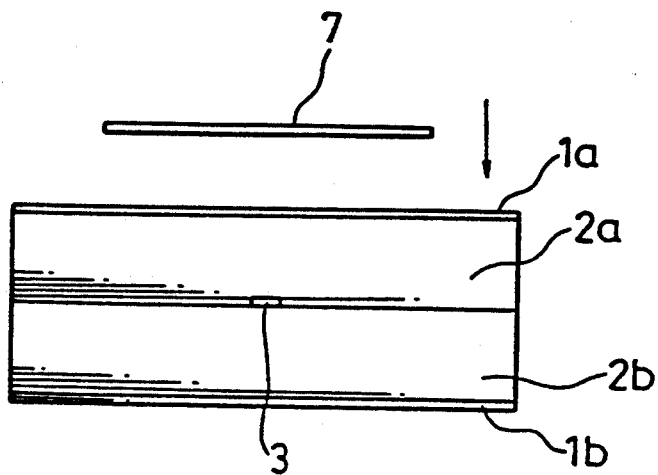
FIG. 13 is a side view illustrating the prior art tri-plate type multiple layer ceramic package of FIG. 11 which is hermetically sealed.
Figure 14A:
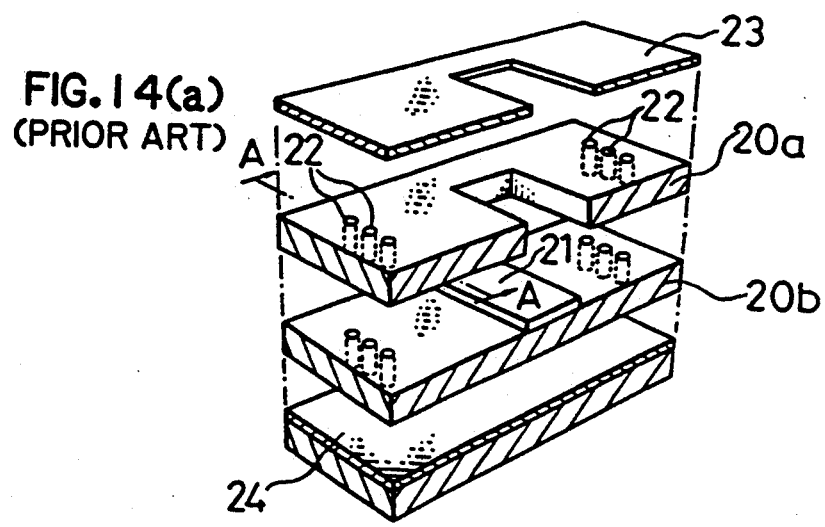
FIG. 14(a) is an exploded view illustrating a structure of a prior art ceramic package using through holes and FIG. 14(b) is a cross-sectional view thereof.
Figure 14B:
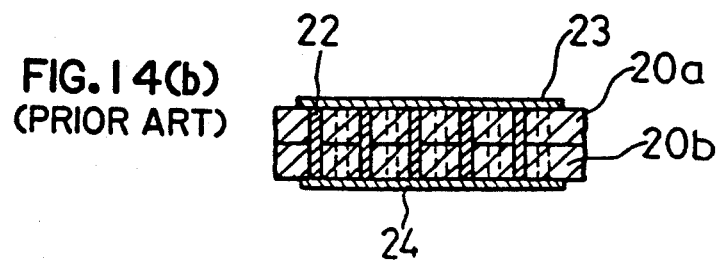

FIG. 1 is a perspective view illustrating a structure of a microwave IC tri-plate type multi-layer ceramic package in accordance with a first embodiment of the present invention. FIG. 2 is a plan view of the microwave IC tri-plate type multi-layer ceramic package of FIG. 1 and FIG. 3 is a side view thereof. FIG. 7 is a side cross section of the microwave IC tri-plate type multi-layer ceramic package of FIG. 1 on which an IC chip 30 is mounted. FIG. 8 is a plan view cross-section of the microwave IC package of FIG. 1 on which the IC chip 30 is mounted. In FIGS. 1, 2, 3, 7 and 8, a lower dielectric layer 2b is provided on a lower-layer grounding metal film 1b. A transmission line 6 which inputs and outputs signals to the IC chip 30 is provided on the lower dielectric layer 2b. An intermediate-layer grounding metal film 1c is provided on the same plane as the transmission line 6 is provided, thereby forming a co-planar type line. Furthermore, an upper dielectric layer 2a and an upper-layer grounding metal film 1a are produced on the intermediate-layer grounding metal 1c, thereby forming a tri-plate type line. Ordinarily, gold (electrolytically plated), tungsten, gold-plated tungsten or the like is used as the grounding metal film. An IC chip bonding part 4 is provided in the aperture 9 formed in the center of the upper dielectric layer 2a and the upper-layer grounding metal film 1a. In some cases, a metal film is plated on the side walls of the aperture 9 to shield the IC chip 30 in accordance with the performance to be pursued or the production cost of the device. The IC chip bonding part 4 is connected to the lower-layer grounding metal film 1b through via holes 5a. The IC chip bonding part 4 comprises a material such as gold-plated titanium or gold-plated AlN (aluminum nitride). The upper-layer, intermediate-layer, and lower-layer grounding metal films 1a, 1c, and 1b are electrically connected to one another via the through holes 5. The IC chip 30 is shielded by the via holes 5 surrounding the chip. Furthermore, the rear surface of the IC chip bonding part 4 is connected to the lower-layer grounding metal film 1b through the via holes 5a.

Figure 4:
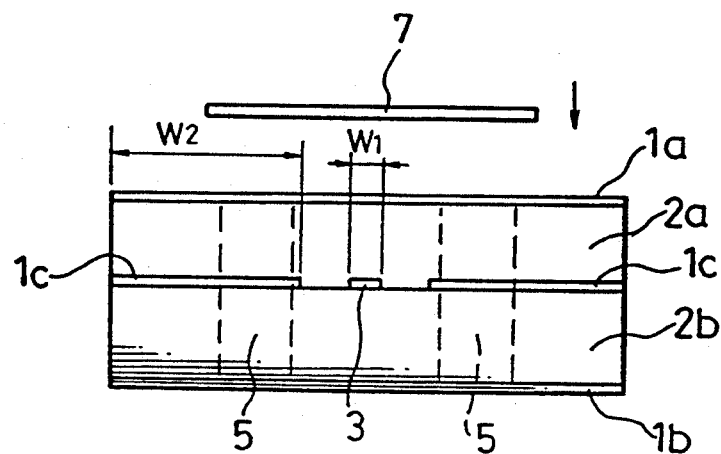
FIG. 4 is a side view illustrating the microwave IC package of FIG. 1 which is hermetically sealed.

As shown in FIG. 7, the IC chip 30 is bonded on the IC chip bonding part 4 using solder, adhesive or the like, and then the transmission line 6, which is insulated, is produced on the dielectric layer 2 comprising ceramic. A metal lid 7 is put on the package, as shown in FIG. 4, to protect the IC chip 30 and to form an airtight enclosure.

In the above-described first embodiment, the intermediate-layer grounding metal film 1c and the transmission line 6 form the co-planar type line, and the upper-layer, intermediate-layer, and lower-layer grounding metal films 1a, 1c, and 1b form the tri-plate type line, and these three grounding metal films are connected to one another through the via holes. Therefore, the perimeter i.e., spacing of the shielding metal surrounding the transmission line 6 in the cross-section perpendicular to the transmission line 6 is shortened and the transmission line 6 is shielded by the via holes 5 in the direction parallel to the transmission line 6, resulting in large improvements in shielding characteristics and the high frequency characteristic. The package having such structure can be practically used at 18 to 30 GHz. In addition, this package can be easily produced because of its simple structure, low production cost, and low material cost.

The package in accordance with the first embodiment has the following aspects and advantages as compared with the prior art IC package shown in FIG. 16. That is, in this embodiment, a plurality of via holes 5 are produced at the both sides of the transmission line 6 to form the pseudo-coaxial line configuration similarly as in the prior art device of FIG. 16 and further the via holes 5 are provided closer to the transmission line 6 than in the prior art device, thereby improving the shielding and high frequency characteristics. Furthermore, as shown in FIG. 4, the width of the metal layer connecting between via holes, that is, the width $W_2$ of the intermediate-layer grounding metal film is three to five times the width $W_1$ of the transmission line 6, whereby a leakage of the electrical lines of force is reduced and transmission loss and an increase in the voltage standing wave ratio, which are caused by a higher order transmission modes, are prevented. Furthermore, the IC chip 30 can be easily sealed up using this package as shown in FIG. 4. Consequently, an IC package having good shielding and high-frequency characteristics can be obtained at low production cost.

Figure 5:
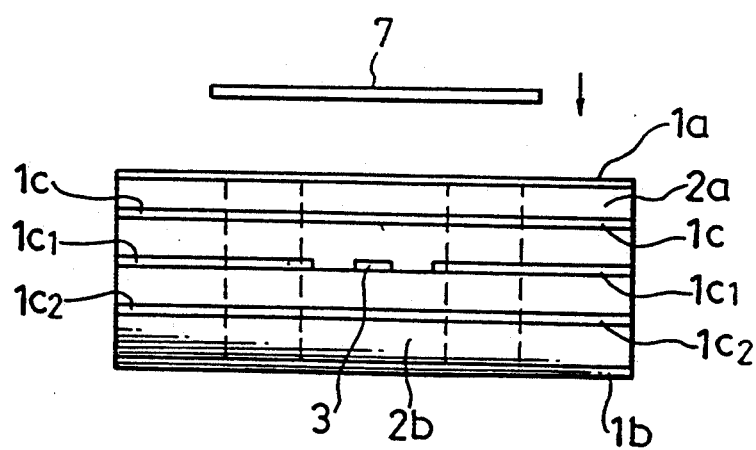
FIG. 5 is a side view illustrating a microwave IC package comprising a plurality of intermediate-layer grounding metals, which is hermetically sealed, in accordance with a second embodiment, of the present invention.
Figure 6A:
FIGS. 6(a) to 6(f) are perspective views illustrating structures of respective layers of the microwave IC package of FIG. 5.
Figure 6B:
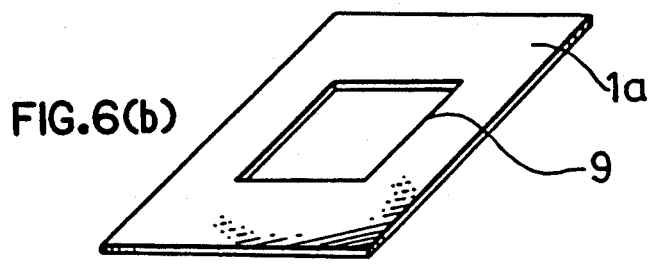
Figure 6C:
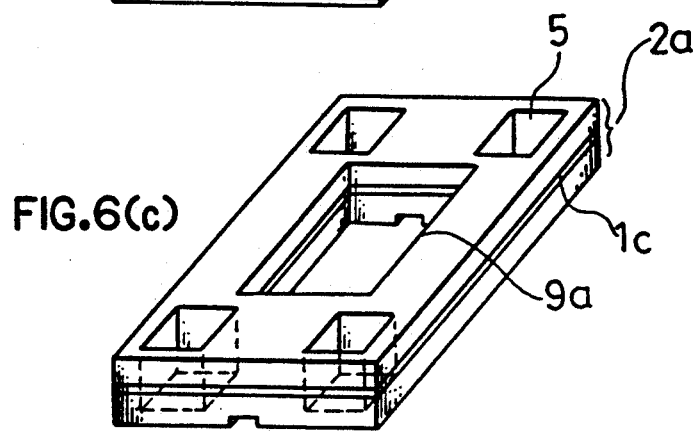
Figure 6D:
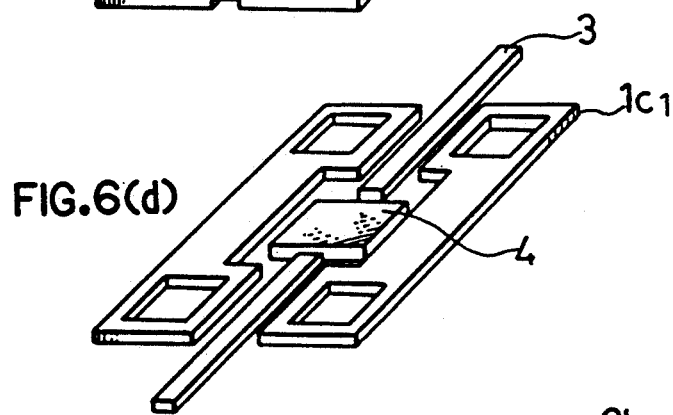
Figures 6E, 6F:
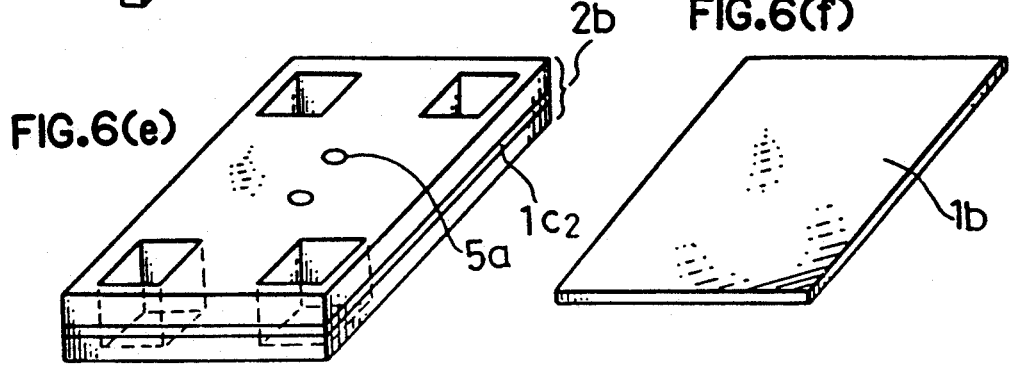

FIG. 5 is a cross-sectional view showing a tri-plate type multi-layer ceramic package in which an IC chip 30 is sealed in accordance with a second embodiment of the present invention. FIGS. 6(a) to 6(f) are perspective views of respective layers of the tri-plate type multi-layer ceramic package of FIG. 5. In FIGS. 5 and 6, reference characters $1c_1$ and $1c_2$ designate intermediate-layer grounding metal films.

In this second embodiment, a plurality of intermediate-layer grounding metal films $1c$ to $1c_2$ are produced, whereby the package has a larger number of grounding surfaces than the package of the first embodiment, enhancing the shielding and high frequency characteristics.

While in the above-described second embodiment a two-port package is described, the present invention may be applied to a package with three or more ports and achieve the same effects as described above.

While in the above-described embodiments ceramic is used as the dielectric layer 2, LFM (low temperature firing material including glass), AlN (aluminum nitride), or PTFE (porous Teflon) can be used as the material therefor.

As is evident from the foregoing description, according to the present invention, a microwave IC package comprises a first intermediate-layer grounding metal film and a transmission line, both produced on the same surface, to form a co-planar type line, upper and lower-layer grounding metal film which are provided above and below the first intermediate-layer grounding metal film to form a tri-plate type line, and via holes connecting all the three grounding metal films. Therefore, the transmission line is shielded in the direction parallel to the transmission line, and further, the spacing of the shielding metal from the transmission line perpendicular the transmission line is shortened. As a result, the inductive component is suppressed.

In addition, since the width of the intermediate-layer grounding metal film is three to five times as that of the transmission line, the leakage of the electrical lines of force is reduced, whereby the shielding and high frequency characteristics are improved. As well, the package can be produced at a low production cost.

In addition, a second intermediate-layer grounding metal film is produced at at least one of position between the upper and the first intermediate-layer grounding metal films and between the first intermediate-layer and the lower-layer grounding metal films and all the grounding metal films are connected to one another through via holes. Therefore, the shielding characteristics can be further improved with the effects described above.

What is claimed is:

1. A package for a microwave integrated circuit comprising:
   a first dielectric layer having opposed front and rear surfaces;

a transmission line disposed on said front surface for electrically connecting a microwave integrated circuit disposed on said front surface;

a second dielectric layer having opposed front and rear surfaces, said rear surface of said second dielectric layer being disposed on said front surface of said first dielectric layer sandwiching said transmission line, said second dielectric layer including a central aperture for surrounding a microwave integrated circuit disposed on the front surface of said first dielectric layer;

a first grounding metal film disposed on said rear surface of said first dielectric layer;

a second grounding metal film disposed on said front surface of said second dielectric layer;

a first intermediate layer grounding metal film disposed between said front surface of said first dielectric layer and said rear surface of said second dielectric layer, forming a co-planar type line with said transmission line; and via holes electrically connecting said first intermediate layer grounding metal film with said first and second grounding metal films.

2. A package for a microwave integrated circuit in accordance with claim 1 wherein said first and second metal films comprise one of electrolytically plated gold, tungsten, and gold-plated tungsten.

3. A package for a microwave integrated circuit in accordance with claim 1 wherein said dielectric layer comprises one of ceramic, low temperature firing glass, aluminum nitride, and porous Teflon.

4. A package for a microwave integrated circuit in accordance with claim 1 including an IC chip bonding part on said first dielectric layer to which a microwave integrated circuit is bonded comprising one of gold-plated titanium and gold-plated aluminum nitride.

5. A package for a microwave integrated circuit in accordance with claim 1 wherein said second dielectric layer includes metal-plated side walls at the central aperture contacting said second grounding metal film.

6. A package for a microwave integrated circuit in accordance with claim 1 wherein said via holes electrically connect said first and second grounding metal films.

7. A package for a microwave integrated circuit in accordance with claim 1 which can be practically used at 18 to 30 GHz.

8. A package for a microwave integrated circuit in accordance with claim 1 including a plurality of via holes disposed on opposite sides of said transmission line, forming a pseudo-coaxial line.

9. A package for a microwave integrated circuit in accordance with claim 1 wherein said first intermediate layer grounding metal film and said transmission line have respective widths on the front surface of said first dielectric layer and the width of said intermediate layer grounding metal film is three to five times the width of said transmission line.

10. A package for a microwave integrated circuit in accordance with claim 1 comprising:

a second intermediate layer grounding metal film disposed between said first grounding metal film and said first intermediate layer grounding metal film; and via holes electrically connecting said second intermediate layer grounding metal film to said first and second grounding metal films.

11. A package for a microwave integrated circuit in accordance with claim 10 wherein said first and second intermediate layer grounding metal films comprises one of electrolytically plated gold, tungsten, and gold-plated tungsten.

12. A package for a microwave integrated circuit in accordance with claim 10 wherein said dielectric layer comprises one of ceramic, low temperature firing glass, aluminum nitride, and porous Teflon.

13. A package for a microwave integrated circuit in accordance with claim 10 including an IC chip bonding part on said first dielectric layer to which a microwave integrated circuit is bonded comprising one of titanium mixed with gold and aluminum nitride mixed with gold.

14. A package for a microwave integrated circuit in accordance with claim 10 wherein said second dielectric layer includes metal-plated side walls at the central aperture contacting said second grounding metal film.

15. A package for a microwave integrated circuit in accordance with claim 10 wherein said via holes electrically connect said first and second grounding metal films.

16. A package for a microwave integrated circuit in accordance with claim 10 including a plurality of via holes disposed on opposite sides of said transmission line, forming a pseudo-coaxial line.

17. A package for a microwave integrated circuit in accordance with claim 10 wherein said first intermediate layer grounding metal film and said transmission line have respective widths on the front surface of said first dielectric layer and the width of said intermediate layer grounding metal film is three to five times the width of said transmission line.

18. A package for a microwave integrated circuit in accordance with claim 1 comprising:

a second intermediate layer grounding metal film disposed between said second grounding metal film and said first intermediate layer grounding metal film; and via holes electrically connecting said second intermediate layer grounding metal film to said first and second grounding metal films.

* * * * *